United States Patent [19]

Suzuki et al.

[11] 4,302,086

[45] Nov. 24, 1981

[54] LIQUID CRYSTAL INDICATOR IN CAMERA FINDER

[75] Inventors: Ryoichi Suzuki, Kawasaki; Takashi Uchiyama, Yokohama; Hiroyasu Murakami, Tokyo; Masaharu Kawamura, Kawasaki; Shinji Sakai, Tokyo; Kikuo Momiyama, Yokohama, all of Japan

[73] Assignee: Canon Kabushiki Kaisha, Tokyo, Japan

[21] Appl. No.: 121,307

[22] Filed: Feb. 13, 1980

[30] Foreign Application Priority Data

Feb. 20, 1979 [JP] Japan ................... 54-19300

[51] Int. Cl.³ ............................................. G03B 17/20
[52] U.S. Cl. ..................... 354/53; 354/289; 354/60 E; 354/72; 352/171; 350/336; 340/765
[58] Field of Search ............ 354/53, 39, 298, 57, 354/60 E, 60 L, 72; 352/171; 350/331 R, 332, 336; 340/765, 791, 792

[56] References Cited

U.S. PATENT DOCUMENTS 3,727,527  4/1973  Borowski ..................... 354/53
4,050,064  9/1977  Hashimoto et al. ........... 350/332

Primary Examiner—L. T. Hix
Assistant Examiner—Stafford D. Schreyer
Attorney, Agent, or Firm—Toren, McGeady & Stanger

[57] ABSTRACT

A liquid crystal cell of elongated shape adapted to be arranged at one side of the field of view of the camera finder has a plurality of opposing of transparent electrodes on opposite sides of a liquid crystal layer which are aligned to each other in a matrix form, whereby the necessary number of leads is reduced. In order for the liquid crystal layer to present an indication in a selected area, or areas, an alternating voltage is applied across the correspondingly aligned electrodes, while still preventing the above-identified alternating voltage to appear at two or more electrodes in one set simultaneously even when light is blocked in the two separated areas of the liquid crystal layer. In other words, the number of those of the plurality of electrodes in set to which the alternating voltage is applied at a time depending upon the exposure value is limited always to only one even when two separated areas are selected for light shuttering at a time. Thus, the exposure values or shutter times can be indicated in half-steps increments.

10 Claims, 35 Drawing Figures

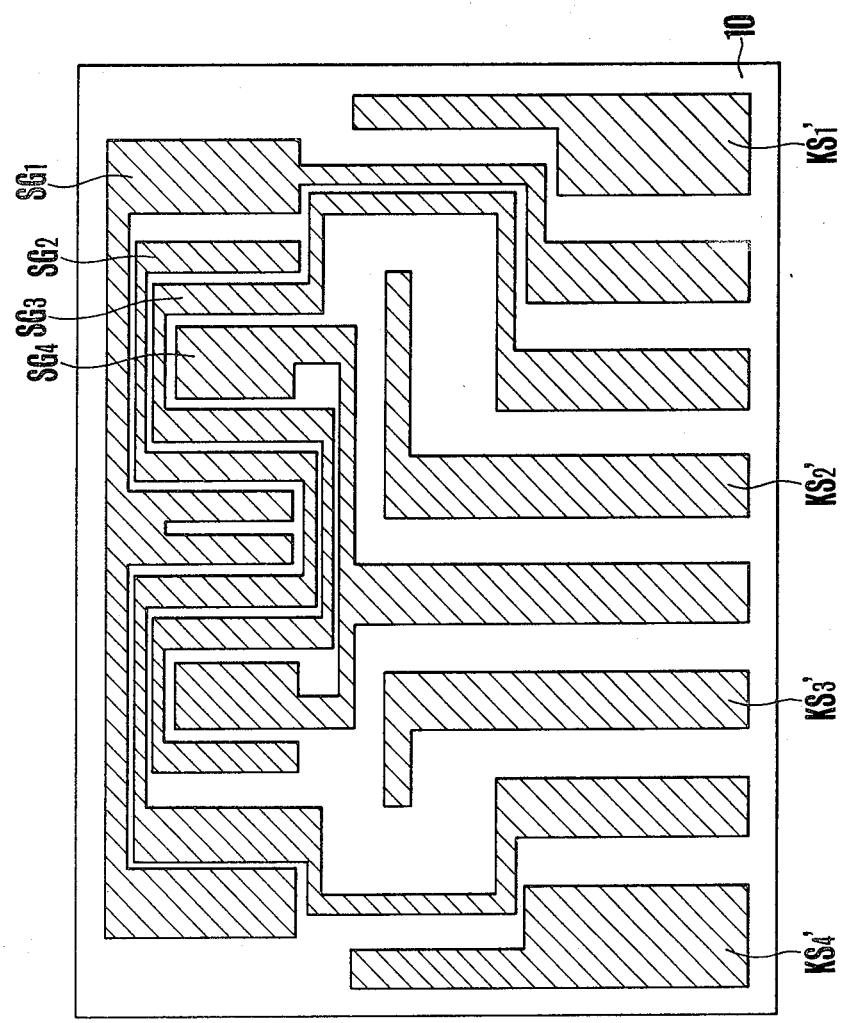

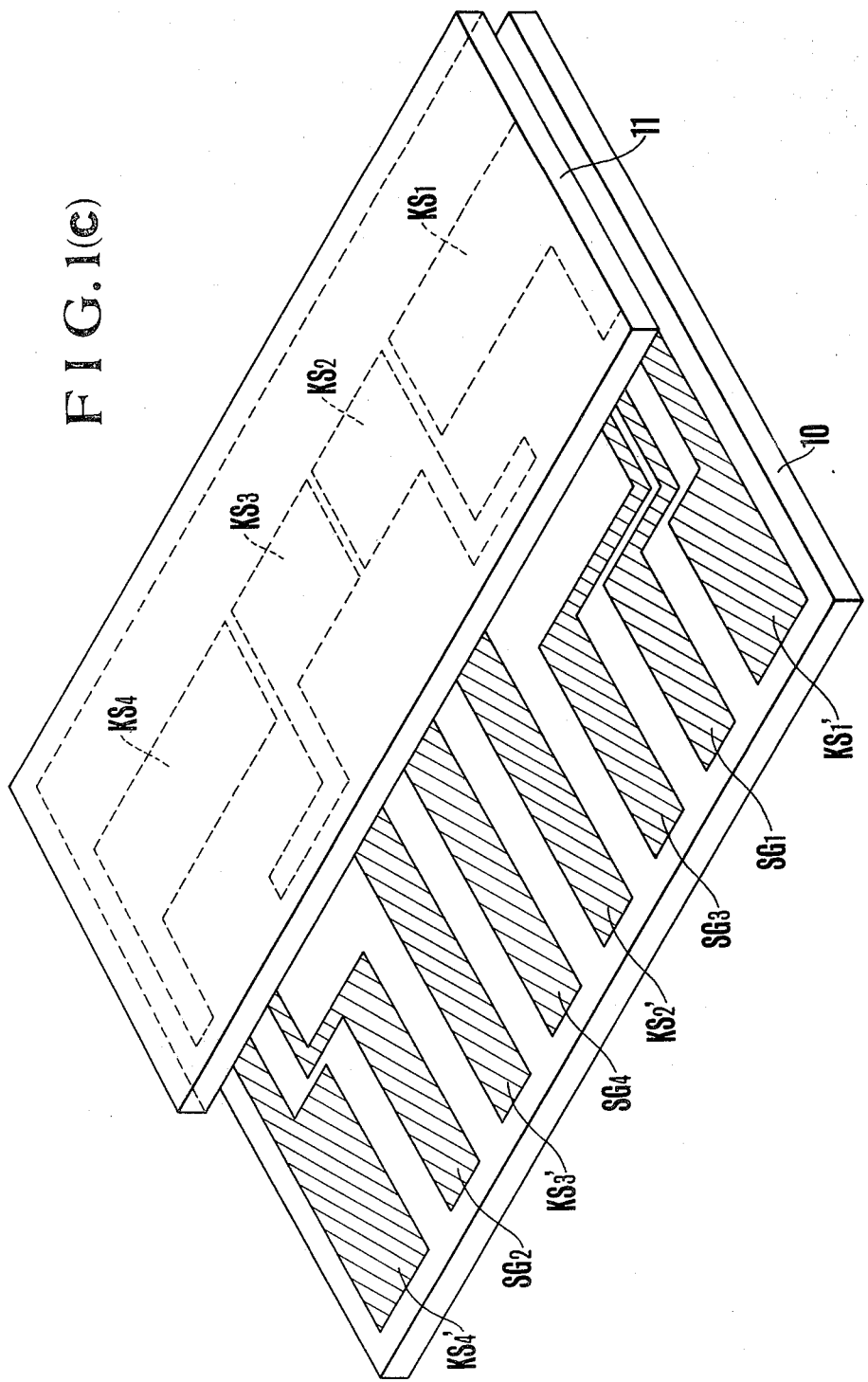

FIG. 2

FIG. 2
(h)
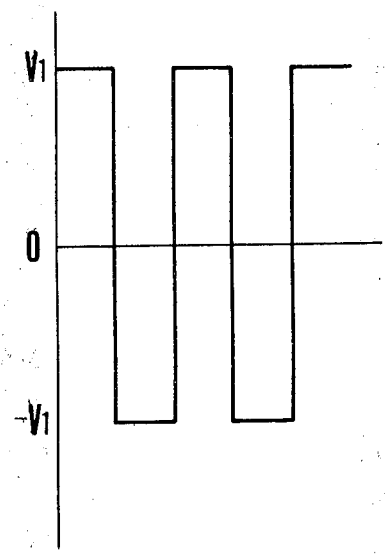
(i)
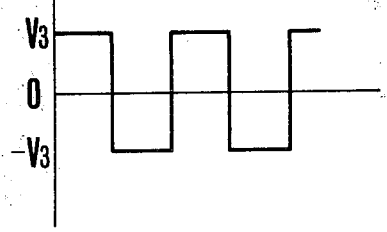
(j)
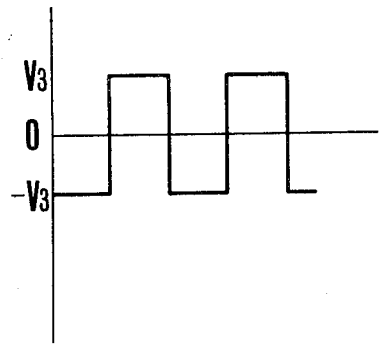

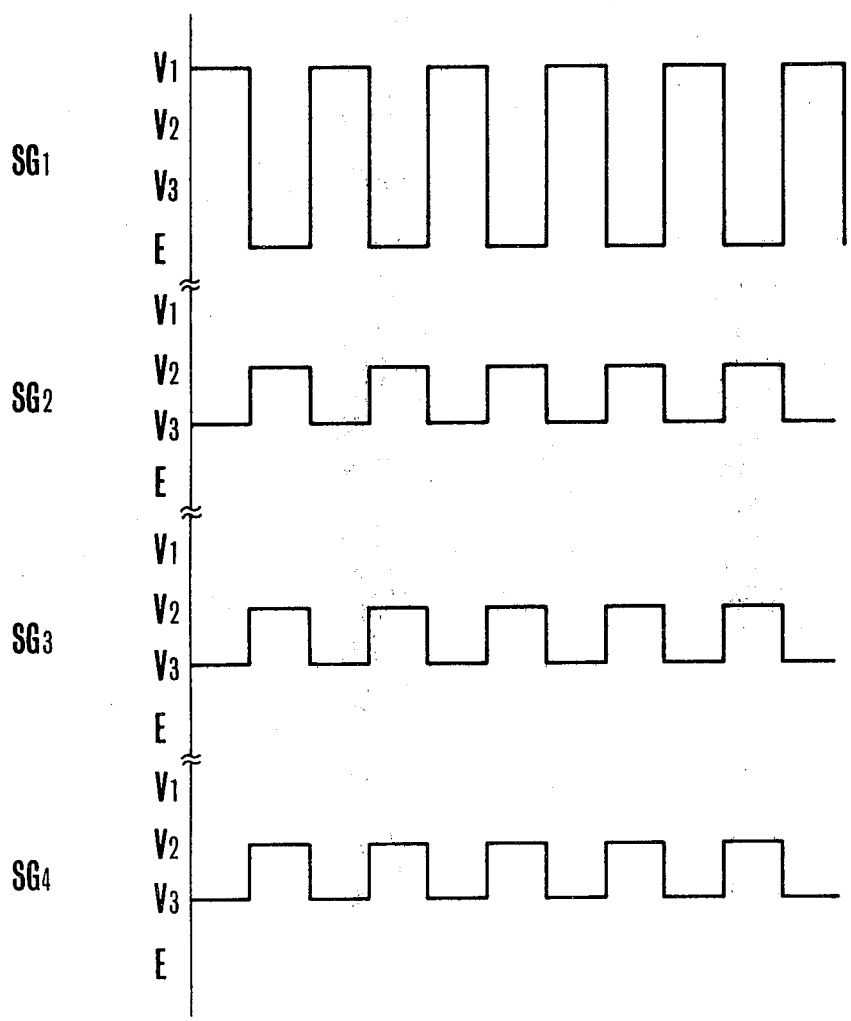

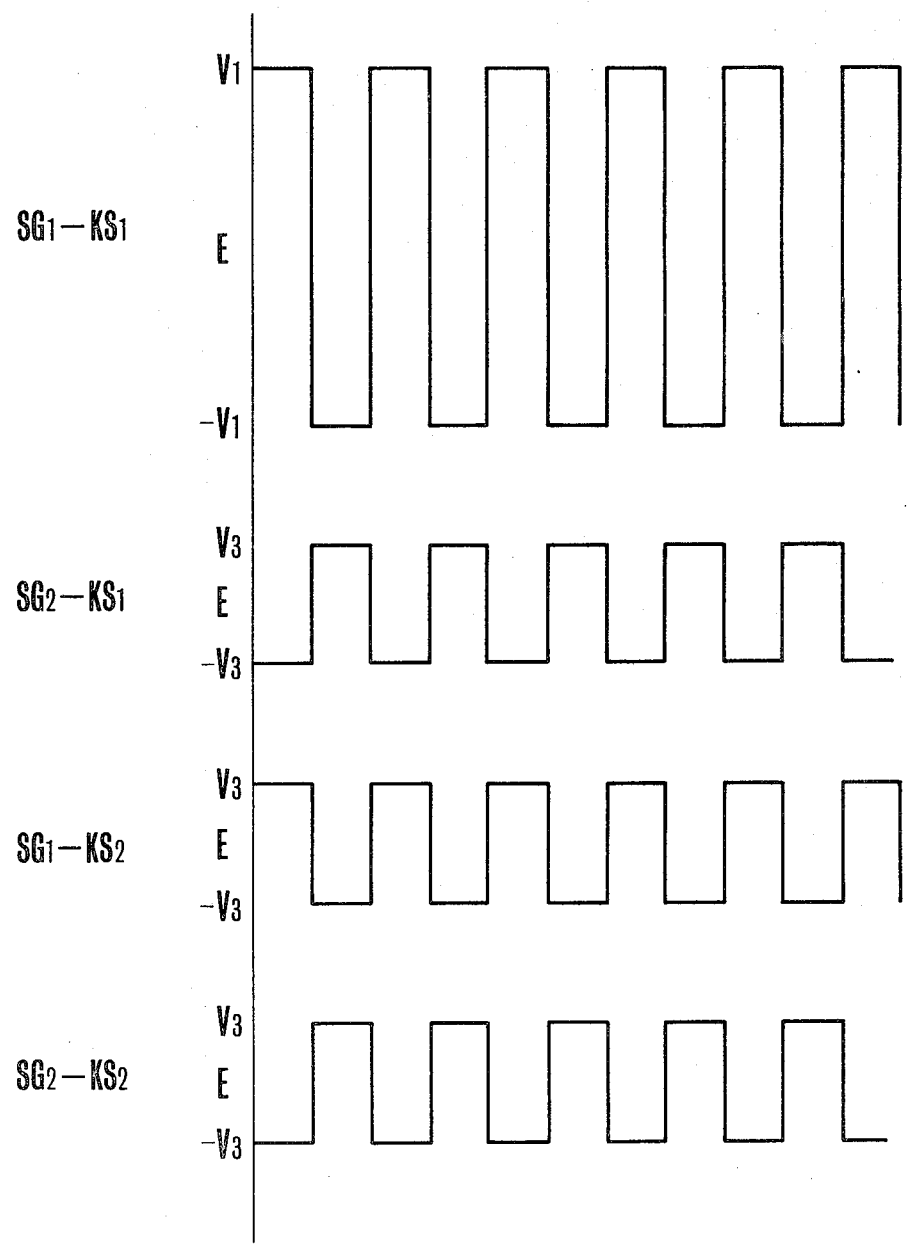

FIG.4(e)

| DECODER OUTPUT STAGE | KS1 | KS2 | KS3 | KS4 | SG1 | SG2 | SG3 | SG4 | SELECTED AREA FOR LIGHT SHUTTER |
|---|---|---|---|---|---|---|---|---|---|
| 1 | $L_2$ | $L_1$ | $L_1$ | $L_1$ | $L_4$ | $L_3$ | $L_3$ | $L_3$ | $D_1$ |
| 2 | $L_2$ | $L_1$ | $L_1$ | $L_1$ | $L_3$ | $L_4$ | $L_3$ | $L_3$ | $D_2$ |
| 3 | $L_2$ | $L_1$ | $L_1$ | $L_1$ | $L_3$ | $L_4$ | $L_4$ | $L_3$ | $D_2$  $D_3$ |
| 4 | $L_2$ | $L_1$ | $L_1$ | $L_1$ | $L_3$ | $L_3$ | $L_4$ | $L_3$ | $D_3$ |
| 5 | $L_2$ | $L_1$ | $L_1$ | $L_1$ | $L_3$ | $L_3$ | $L_4$ | $L_4$ | $D_3$  $D_4$ |
| 6 | $L_2$ | $L_1$ | $L_1$ | $L_1$ | $L_3$ | $L_3$ | $L_3$ | $L_4$ | $D_4$ |
| 7 | $L_2$ | $L_2$ | $L_1$ | $L_1$ | $L_3$ | $L_3$ | $L_3$ | $L_4$ | $D_4$  $D_5$ |
| 8 | $L_1$ | $L_2$ | $L_1$ | $L_1$ | $L_3$ | $L_3$ | $L_3$ | $L_4$ | $D_5$ |
| 9 | $L_1$ | $L_2$ | $L_1$ | $L_1$ | $L_3$ | $L_3$ | $L_4$ | $L_4$ | $D_5$  $D_6$ |
| 10 | $L_1$ | $L_2$ | $L_1$ | $L_1$ | $L_3$ | $L_3$ | $L_4$ | $L_3$ | $D_6$ |
| 11 | $L_1$ | $L_2$ | $L_1$ | $L_1$ | $L_3$ | $L_4$ | $L_4$ | $L_3$ | $D_6$  $D_7$ |
| 12 | $L_1$ | $L_2$ | $L_1$ | $L_1$ | $L_3$ | $L_4$ | $L_3$ | $L_3$ | $D_7$ |
| 13 | $L_1$ | $L_2$ | $L_1$ | $L_1$ | $L_4$ | $L_4$ | $L_3$ | $L_3$ | $D_7$  $D_8$ |
| 14 | $L_1$ | $L_2$ | $L_1$ | $L_1$ | $L_4$ | $L_3$ | $L_3$ | $L_3$ | $D_8$ |
| 15 | $L_1$ | $L_2$ | $L_2$ | $L_1$ | $L_4$ | $L_3$ | $L_3$ | $L_3$ | $D_8$  $D_9$ |
| 16 | $L_1$ | $L_1$ | $L_2$ | $L_1$ | $L_4$ | $L_3$ | $L_3$ | $L_3$ | $D_9$ |
| 17 | $L_1$ | $L_1$ | $L_2$ | $L_1$ | $L_4$ | $L_4$ | $L_3$ | $L_3$ | $D_9$  $D_{10}$ |
| 18 | $L_1$ | $L_1$ | $L_2$ | $L_1$ | $L_3$ | $L_4$ | $L_3$ | $L_3$ | $D_{10}$ |
| 19 | $L_1$ | $L_1$ | $L_2$ | $L_1$ | $L_3$ | $L_4$ | $L_4$ | $L_3$ | $D_{10}$  $D_{11}$ |
| 20 | $L_1$ | $L_1$ | $L_2$ | $L_1$ | $L_3$ | $L_3$ | $L_4$ | $L_3$ | $D_{11}$ |
| 21 | $L_1$ | $L_1$ | $L_2$ | $L_1$ | $L_3$ | $L_3$ | $L_4$ | $L_4$ | $D_{11}$  $D_{12}$ |
| 22 | $L_1$ | $L_1$ | $L_2$ | $L_1$ | $L_3$ | $L_3$ | $L_3$ | $L_4$ | $D_{12}$ |
| 23 | $L_1$ | $L_1$ | $L_2$ | $L_2$ | $L_3$ | $L_3$ | $L_3$ | $L_4$ | $D_{12}$  $D_{13}$ |
| 24 | $L_1$ | $L_1$ | $L_1$ | $L_2$ | $L_3$ | $L_3$ | $L_3$ | $L_4$ | $D_{13}$ |
| 25 | $L_1$ | $L_1$ | $L_1$ | $L_2$ | $L_3$ | $L_3$ | $L_4$ | $L_4$ | $D_{13}$  $D_{14}$ |
| 26 | $L_1$ | $L_1$ | $L_1$ | $L_2$ | $L_3$ | $L_3$ | $L_4$ | $L_3$ | $D_{14}$ |
| 27 | $L_1$ | $L_1$ | $L_1$ | $L_2$ | $L_3$ | $L_4$ | $L_4$ | $L_3$ | $D_{14}$  $D_{15}$ |
| 28 | $L_1$ | $L_1$ | $L_1$ | $L_2$ | $L_3$ | $L_4$ | $L_3$ | $L_3$ | $D_{15}$ |
| 29 | $L_1$ | $L_1$ | $L_1$ | $L_2$ | $L_4$ | $L_3$ | $L_3$ | $L_3$ | $D_{16}$ |

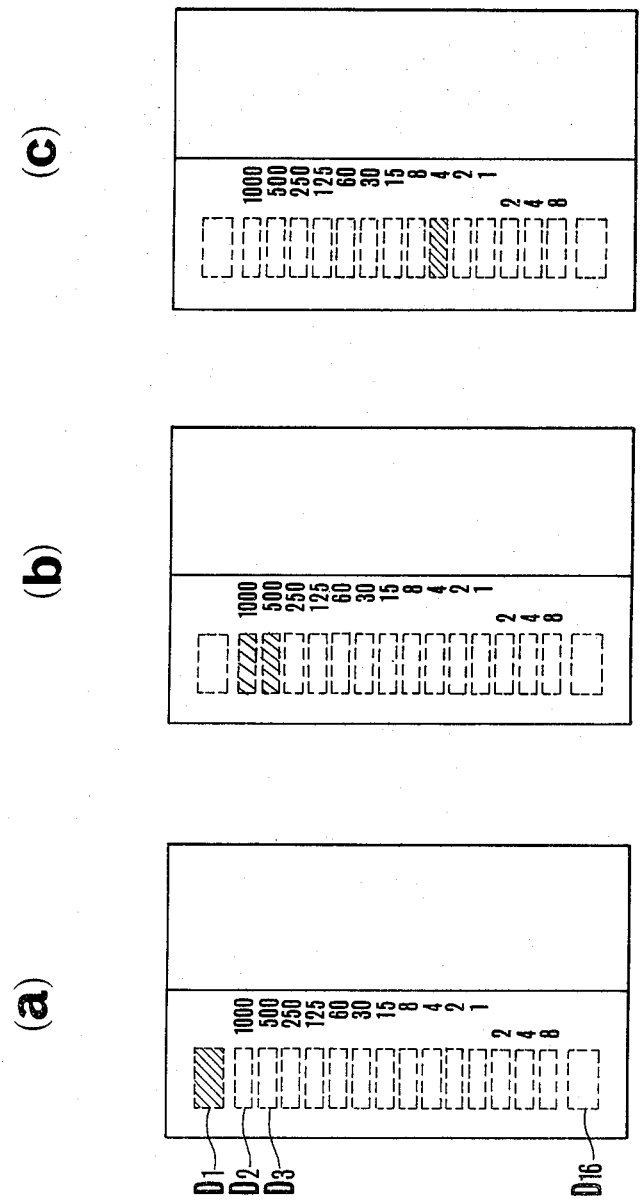

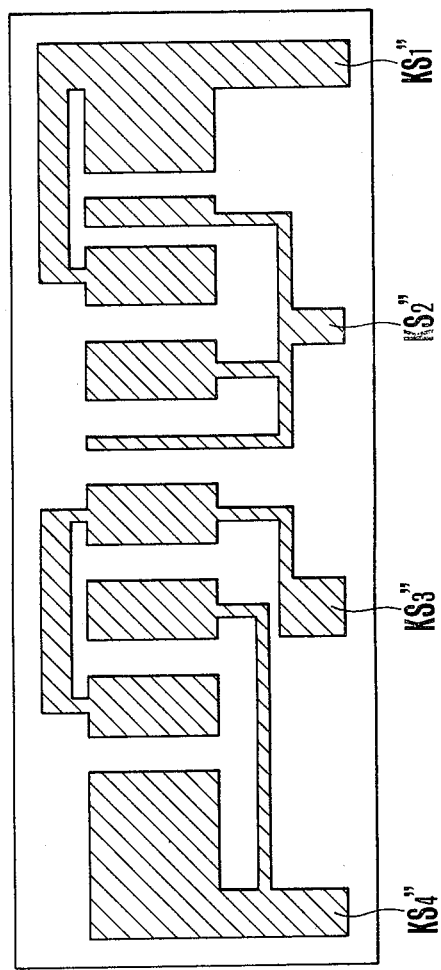

FIG.8

| DECODER OUTPUT STAGE | KS1" | KS2" | KS3" | KS4" | SG1" | SG2" | SG3" | SG4" | SELECTED AREA FOR LIGHT SHUTTER | |
|---|---|---|---|---|---|---|---|---|---|---|
| 1 | $L_2$ | $L_1$ | $L_1$ | $L_1$ | $L_4$ | $L_3$ | $L_3$ | $L_3$ | $D'_1$ | |
| 2 | $L_2$ | $L_2$ | $L_1$ | $L_1$ | $L_3$ | $L_4$ | $L_3$ | $L_3$ | $D'_2$ | $D'_3$ |
| 3 | $L_2$ | $L_1$ | $L_1$ | $L_1$ | $L_3$ | $L_4$ | $L_4$ | $L_3$ | $D'_3$ | $D'_4$ |
| 4 | $L_2$ | $L_2$ | $L_1$ | $L_1$ | $L_3$ | $L_3$ | $L_4$ | $L_3$ | $D'_4$ | $D'_5$ |
| 5 | $L_1$ | $L_2$ | $L_1$ | $L_1$ | $L_3$ | $L_3$ | $L_4$ | $L_4$ | $D'_5$ | $D'_6$ |
| 6 | $L_1$ | $L_2$ | $L_1$ | $L_1$ | $L_4$ | $L_3$ | $L_3$ | $L_4$ | $D'_6$ | $D'_7$ |
| 7 | $L_1$ | $L_2$ | $L_2$ | $L_1$ | $L_4$ | $L_3$ | $L_3$ | $L_3$ | $D'_7$ | $D'_8$ |
| 8 | $L_1$ | $L_1$ | $L_2$ | $L_1$ | $L_4$ | $L_3$ | $L_3$ | $L_4$ | $D'_8$ | $D'_9$ |
| 9 | $L_1$ | $L_1$ | $L_2$ | $L_2$ | $L_3$ | $L_3$ | $L_3$ | $L_4$ | $D'_9$ | $D'_{10}$ |
| 10 | $L_1$ | $L_1$ | $L_1$ | $L_2$ | $L_3$ | $L_3$ | $L_4$ | $L_4$ | $D'_{10}$ | $D'_{11}$ |
| 11 | $L_1$ | $L_1$ | $L_2$ | $L_2$ | $L_3$ | $L_3$ | $L_4$ | $L_3$ | $D'_{11}$ | $D'_{12}$ |
| 12 | $L_1$ | $L_1$ | $L_2$ | $L_1$ | $L_3$ | $L_4$ | $L_4$ | $L_3$ | $D'_{12}$ | $D'_{13}$ |
| 13 | $L_1$ | $L_1$ | $L_2$ | $L_2$ | $L_3$ | $L_4$ | $L_3$ | $L_3$ | $D'_{13}$ | $D'_{14}$ |
| 14 | $L_1$ | $L_1$ | $L_1$ | $L_2$ | $L_4$ | $L_3$ | $L_3$ | $L_3$ | $D'_{15}$ | |

FIG. 9
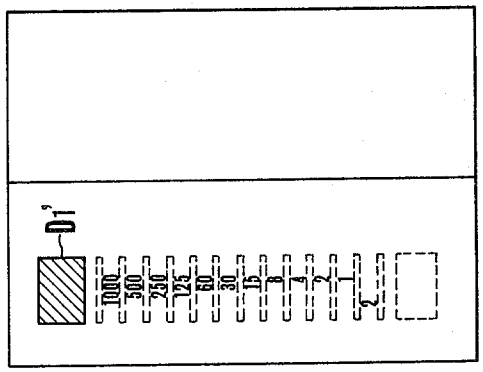
(c)
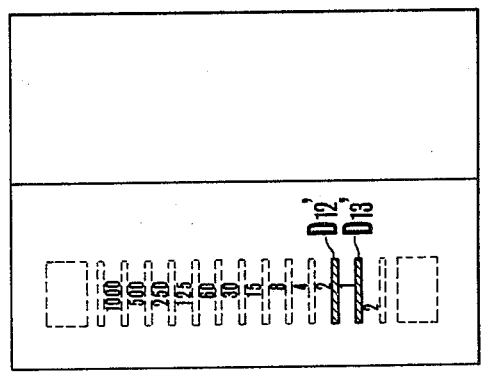
(b)
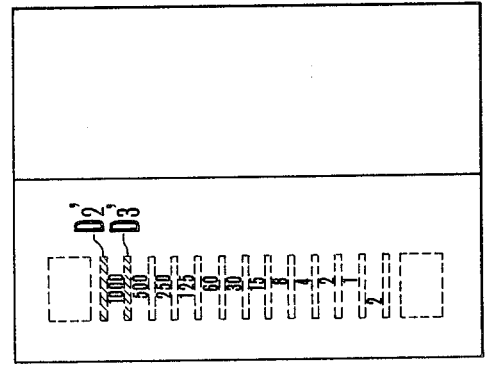
(a)

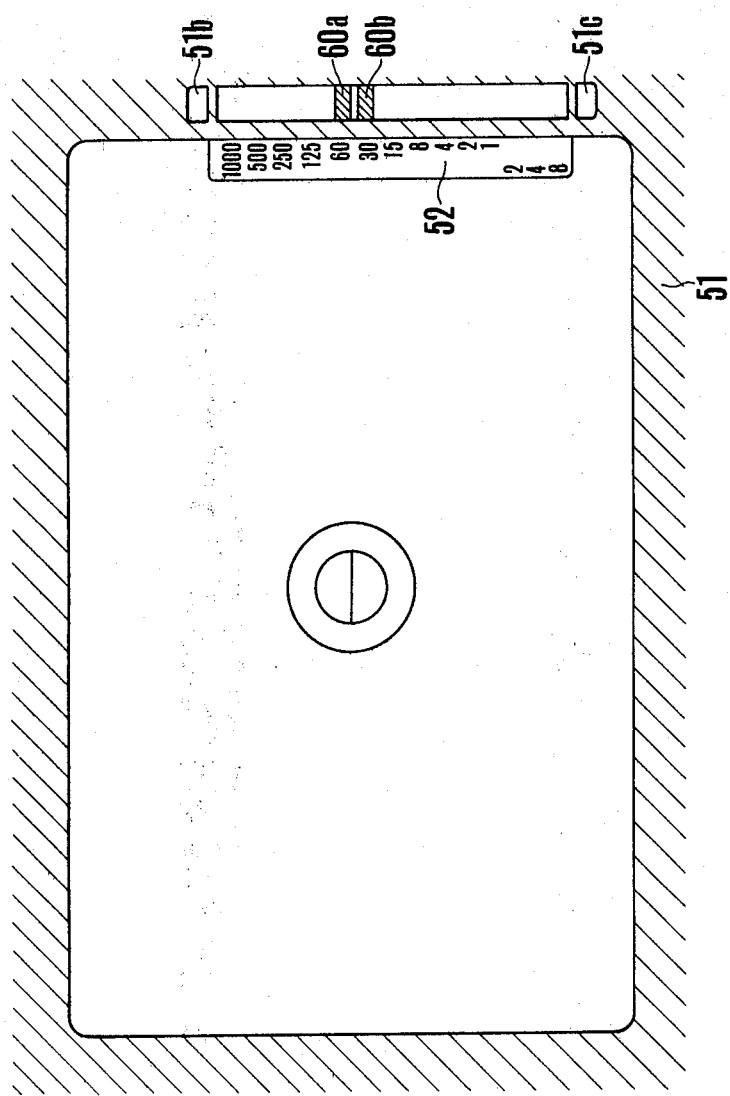

LIQUID CRYSTAL INDICATOR IN CAMERA FINDER

BACKGROUND OF THE INVENTION

This invention relates to photographic cameras having finders with exposure value indicators therein, and more particularly to liquid crystal indicators for use in finders of cameras.

In the art, as exposure value display devices for use in finders of cameras there have been employed pointers of galvanometers, and light-emitting diode (LED) displays. In the case of displays using the galvanometers, however, several drawbacks exist such that they are very sensitive to mechanical shock, takes a large installation space, and requires the provision of a dust-shield. With the LED displays, whether of the 7-segment or dot type, on the other hand, one drawback is that as a great number of LED elements have to be used at a time, a large amount of electrical power is required to operate them, and behaves as a large load over the small size battery such as of the silver oxide type used in the camera. Another drawback is that it is difficult to read the LED display when the field of view of the finder is very bright.

With the foregoing in mind, various methods utilizing liquid crystals for displays in the finders have been proposed with advantages that liquid crystal display elements consume far less electrical power than the corresponding display by the use of LED elements do, enable the photographer looking through the finder to perceive the display very well however brighter the view-field is, and has a small bulk and size in itself taking not so much space for installation.

In the field of art of digital electronic watches and computers, liquid crystal displays have been put into practice in the 7-segment form. The application of this 7-segment type liquid crystal display device to display exposure values in the finder of a camera gives rise to a problem that the necessary number of wiring connections therefor becomes enormous, and the process of assembly cannot be carried out without the accompaniment of large difficulties. In more detail, the liquid crystal display device employing the dynamic drive method, because of its having poor response characteristics, is limited to the presentation of not more than about four places. Further, since the dynamic drive method has a small ratio of effective potentials between the selected and unselected areas, the possibility of occurrence of cross-talk tends to increase as the temperature varies. A device employing the static drive method also has a drawback that the number of wiring connections becomes enormous.

Because of this, liquid crystal cells have been designed to indicate exposure values, such as exposure times, in the form of a dot cooperative with a shutter speed scale. The conventional dot type liquid crystal indicator is required to provide for all dot areas with respective electrodes, and therefore has a drawback that the number of electrodes becomes enormous. Another drawback is that as the electrodes are so arranged that the exposure values are indicated in one-step increments, when half-step increments are desired to indicate, an extremely large number of dot areas must be disadvantageously provided in the liquid crystal unit.

SUMMARY OF THE INVENTION

It is one of the principal objects of the present invention to contemplate the use of a liquid crystal in indicating photographic information within the interior of the finder of a camera as light is shuttered in a selected area or areas, and to provide a liquid crystal arrangement for a camera capable of indicating exposure values in half-steps increments.

Another principal object of the present invention is to provide a liquid crystal exposure indicator of the character described which clearly shows the exposure values to the photographer looking through the camera finder.

Still another principal object of the present invention is to provide a drive control method for a liquid crystal exposure indicator of the character described where a small number of wiring connections are required.

A further different one of the principal objects of the present invention is to provide a camera with a finder using a liquid crystal which is selectively light-shuttered in an area or areas when an exposure value is indicated, and to provide a liquid crystal unit for a camera which is of construction suited for arrangement in the above-described finder.

According to one of the features of the liquid crystal indicator for a camera of the invention, the liquid crystal cell is so constructed that a plurality of separate areas in a liquid crystal layer can be selectively light-shuttered at a time, whereby when, for example, two adjacent areas are selected for light shuttering at a time, it is made possible to indicate that the derived exposure value lies at an intermediate level between the corresponding two apparent exposure values.

According to another feature of the liquid crystal indicator for a camera of the invention, any pair of adjacent areas in the liquid crystal layer to be light-shuttered are positioned upon application of an electric field thereacross simultaneously to sandwich a letter, mark, or numeral representing an exposure value, whereby it is made easy to read the exposure value.

According to still another feature of the liquid crystal indicator for a camera of the present invention, two sets of transparent electrodes on opposite sides of a liquid crystal layer are matrix-wise aligned to each other and the ratio of the potential across the opaque area to that across the transparent one is made to be 3:1, thereby the number of electrodes in set can be reduced, and the number of terminals of the drive source is also reduced to a large extent.

According to a further feature of the liquid crystal indicator of the present invention, it is always insured that even when a plurality of areas in the liquid crystal layer are selected for simultaneous light shuttering, a predetermined voltage is established between only one of the electrodes in one set and the corresponding number of electrodes in the opposite set, while preventing the other areas than the selected ones from being light-shuttered.

According to a furthermore feature of the liquid crystal indicator of the present invention, whilst the sets of electrodes of the liquid crystal cell are aligned in matrix to each other, the resultant areas therebetween arrange themselves in a row. Thus, the liquid crystal indicator is suited to be positioned near or at the field of view of the camera finder.

According to another feature of the liquid crystal indicator for a camera of the present invention, each set of electrodes of the liquid crystal cell have respective leads all of which are provided on one common side thereof, so that the indicator can be positioned at one side of the field of view of the finder without encountering any trouble by the wiring.

BRIEF DESCRIPTION OF THE DRAWINGS

FIG. 1(a) is a plane view of an example of construction and arrangement of two sets of electrodes deposited on one substrate of a liquid crystal cell.

FIG. 1(c) is an end view of the liquid crystal cell constructed with the substrates of FIGS. 1(a) and 1(b).

FIGS. 4(a) to 4(d) are waveforms showing a manner in which the circuit of FIG. 3 operates.

FIG. 4(e) is a table showing the selective application of the various outputs of the decoder to the electrodes of FIG. 3 for light shuttering in selected areas of the liquid crystal layer.

FIGS. 5(a) to 5(c) are plane views showing the presentation of exposure indications cooperative with a shutter time scale according to FIGS. 1 to 4 embodiment.

FIG. 6(b) is a plane view showing one set of common electrodes to those in one of the two sets of FIG. 6(a) deposited on the opposite substrate of the liquid crystal cell.

FIG. 8 is a table showing the selective application of the various outputs of the decoder to the electrodes in FIG. 7 for light shuttering in selected areas of the liquid crystal layer.

FIGS. 9(a) to 9(c) are plane views showing the presentation of exposure indications in cooperation with a shutter time scale in the embodiment of FIGS. 6 to 8.

FIGS. 11(a) and 11(b) are plane views of the exposure indications at one sides of the fields of view of the finders of FIGS. 10(a) and 10(b) respectively.

DETAILED DESCRIPTION OF THE PREFERRED EMBODIMENTS

Figure 1B:
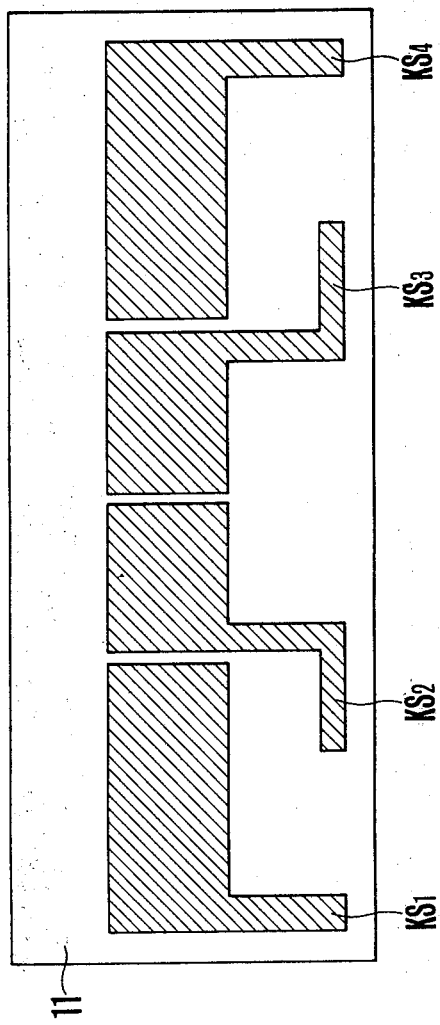
FIG. 1(b) is a plane view of one set of common electrodes to those in one of the sets of FIG. 1(a) deposited on the opposite substrate of the liquid crystal cell.

FIG. 1 shows one embodiment of a liquid crystal cell for use in an exposure indicator of the dot type according to the present invention. This liquid crystal cell is constructed with two substrates of FIGS. 1(a) and 1(b). The substrate of FIG. 1(a) has one set of transparent segment electrodes SG1 to SG4, and four transparent electrodes KS1' to KS4' on a transparent glass plate 10. These transparent electrodes are made from, for example, $SnO_2$-doped $IN_2O_3$, and have electrical conductivity. They may be formed on the transparent glass plate 10 by the vacuum evaporation technique or the like.

Figure 2:
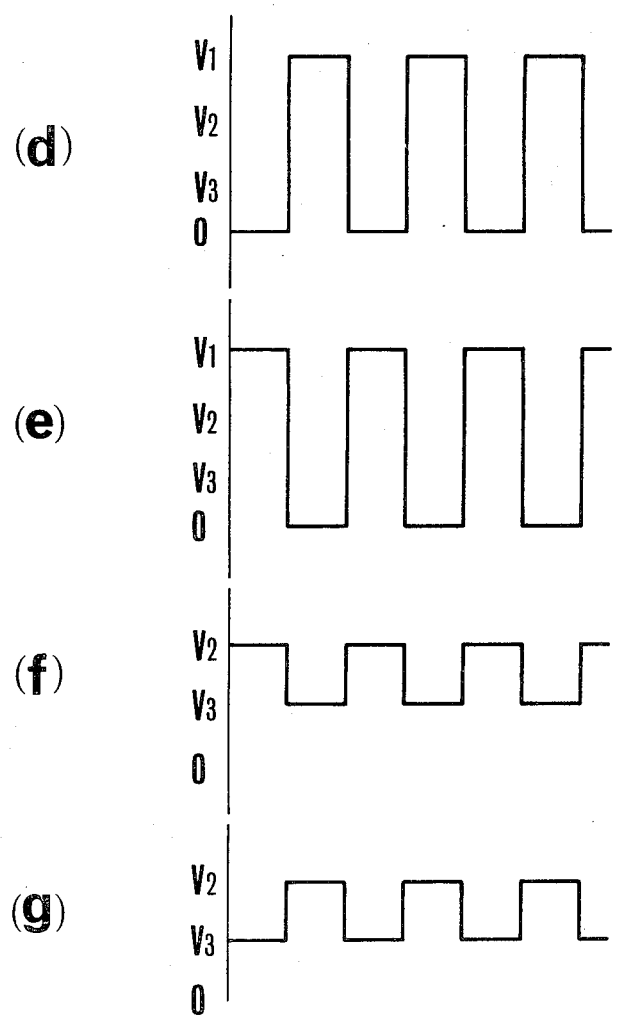
FIG. 2(a) to FIG. 2(c) are schematic views showing the arrangement of the two corresponding sets of electrodes of FIG. 1 for establishment of an electric field in a selected area or areas.
FIGS. 2(d) to 2(j) are waveforms showing a manner in which the liquid crystal cell operates when in FIG. 2(a).

FIG. 1(b) shows the other substrate of the liquid crystal cell with its opposing surface having another set of transparent electrodes KS1 to KS4 common to those KS1' to KS4' of FIG. 1(a) on a transparent glass plate 11. These transparent electrodes KS1 to KS4 are made of conductive material such as $SnO_2$-doped $In_2O_3$ by the vacuum evaporation technique. The plates 10 and 11 of FIGS. 1(a) and 1(b) are assembled in opposing manner as shown in FIG. 1(c). In FIG. 1(c), the transparent electrodes KS1'-KS4' on the plate 10 are electrically connected to the transparent common electrodes KS1-KS4 through connectors (not shown), and a space between the plates is filled with a liquid crystal material and is surrounded by a spacer (not shown). Also two polarizing plates (not shown) are arranged so as to sandwich the plates 10 and 11. In FIGS. 2(a), (b) and (c), the cross states of the common electrodes KS1-KS4 and segment electrodes SG1-SG4 of the liquid crystal cell of FIG. 1 are matrixwise depicted. As is evident from FIG. 2, in the liquid crystal cell used in the present invention, it is made possible by selectively applying a voltage to one segment electrode and one common electrode only to effect light shuttering in a selected area of the liquid crystal layer at which those electrodes intersect as shown in FIG. 2(a). It is also made possible to effect light shuttering in two selected areas when the voltage is selectively applied to either one prescribed common electrode or segment electrode and to either two prescribed common electrodes or segment electrodes intersetting it at those areas only as shown in FIGS. 2(b) and 2(c).

The principles of operation of the present invention will next be described by reference to FIG. 2. Now assuming that a signal of FIG. 2(e) appears at the electrode SG3, a signal of FIG. 2(g) at the electrodes SG1, SG2 and SG3, a signal of FIG. 2(d) at the electrode KS2 and a signal of FIG. 2(f) at the electrodes KS1, KS3 and KS4, then a signal of FIG. 2(h) is established in a cross point (6) only, while signals of FIGS. 2(i) and 2(j) in the other cross points. Further assuming that the voltages V1 and V3 are adjusted as $V1 > Vth > V3$ where Vth is the threshold level of the liquid crystal, only the cross point at which the signal of FIG. 2(h) appears is rendered effective for light shuttering, and in this instance, the one of the areas of the liquid crystal layer at which the electrodes SG3,KS2, that are fed with the signals of FIGS. 2(d) and 2(e) cross one over another, namely, the cross point (6) is selected for light shuttering. The above case holds when the signals of FIGS. 2(d) and 2(e) are applied to the electrodes SG3 and KS2, but it is possible that when the signals of FIGS. 2(d) and 2(e) are applied to desired electrodes, only the one of the areas at which the electrodes that cross one over another are rendered to effect light shuttering. Therefore, the provision of four segment electrodes and four common electrodes as shown in FIG. 2 leads to form sixteen separate indication areas which can be selectively rendered to shutter the light. Thus, in comparison with the conventional liquid crystal indicator, a large number of indicative areas can be selectively operated by using an extremely small number of electrodes. It should be also noted that all the cross points of the matrix are arranged in a row as shown in FIG. 1 and it is therefore possible to consecutively select the points 1 to 16 for light shuttering as the exposure value changes in order.

The foregoing description is directed to the case where the light shuttering is effected in one selected area at a time. In order to present an indication in two selected areas at a time, for example, the cross points 1 and 2, the electrodes SG1, SG2 of FIG. 2(a) are fed with the signal of FIG. 2(e), and the electrodes SG3 and SG4 with the signal of FIG. 2(g), while the electrode KS1 being fed with the signal of FIG. 2(d) and the electrodes KS2 to KS4 with the signal of FIG. 2(f), thereby the signal of FIG. 2(h) is caused to appear at the cross points 1 and 2, and the signals of FIGS. 2(i) and 2(j) at the other cross points, thus presenting indications in spatially adjacent areas at a time.

Figure 3:
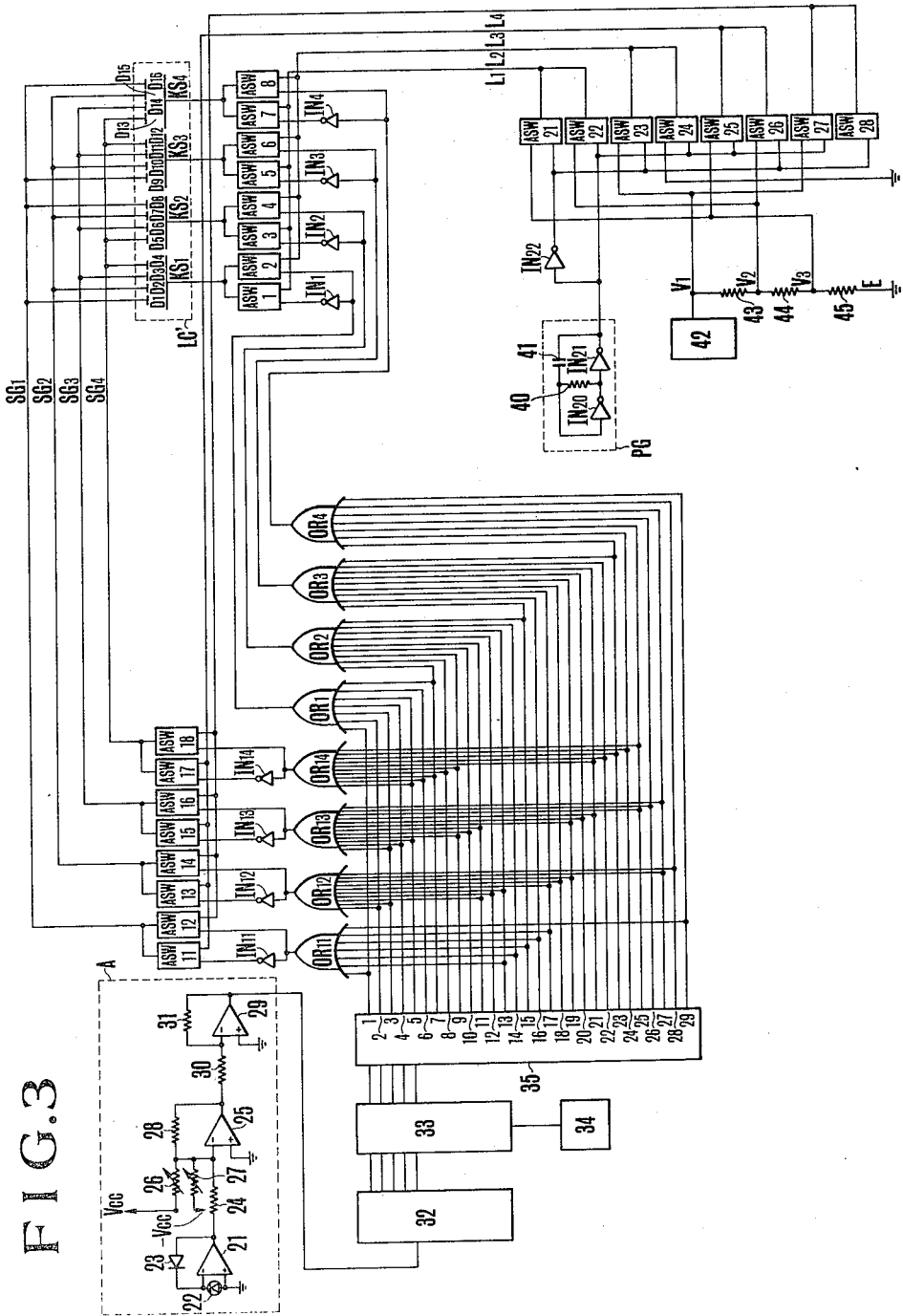
FIG. 3 is an electrical circuit diagram of one embodiment of an exposure indicator for a camera using the liquid crystal cell of FIG. 1.

FIG. 3 shows the circuitry of an exposure indicator for a camera using the liquid crystal cell of FIG. 1 according to the present invention.

In the figure, A is an exposure value computing circuit including an operational amplifier 21 constituting a SPC head amplifier. 22 is a SPC (silicon photo-cell) connected between the two inputs of the operational amplifier 21; 23 is a diode for logarithmic compression connected in the feedback network of the operational amplifier 21. 25 is an operational amplifier constituting part of an adder with its non-inversion input grounded, and with its inversion input connected through a resistor 24 to the output of the operational amplifier 21. 26 and 27 are variable resistors for setting a film speed (ASA) information and preset diaphragm value information respectively; and 28 is a resistor inserted into the feedback network of the aforesaid operational amplifier 25. 29 is an operational amplifier constituting part of an inversion amplifier with its non-inversion input connected to the circuit earth and with its inversion input connected through a resistor 30 to the output of the operational amplifier 25. 31 is a feedback resistor.

32 is an A/D converter for converting the analogue output voltage of the operational amplifier 29 to produce an output in 5-bit binary code. 33 is a latch circuit responsive to the pulse output of a pulse generating circuit 34 for latching a 5-bit input binary code and for producing it. This latch period is previously adjusted to for example, 0.5 seconds. 35 is a decoder receptive of the 5-bit binary coded input for producing a decimal coded output in twenty-nine lines. OR1-OR4 are OR gates with the OR gate OR1 connected to the output terminals 1-7 of the decoder 35, with the OR gate OR2 connected to the output terminals 7-15, with the OR3 connected to the output terminals 15-23, and with the OR4 connected to the output terminals 23-29. OR1-1-OR14 are OR gates with the OR11 connected to the output terminals 1, 13, 14, 15, 16, 17 and 29, with the OR12 connected to the output terminals 2, 3, 11, 12, 13, 17, 18, 19, 27 and 28, with the OR13 connected to the output terminals 3, 4, 5, 9, 10, 11, 19, 20, 21, 25, 26 and 27, and with the OR14 connected to the output terminals 5, 6, 7, 8, 9, 21, 22, 23, 24 and 25 of the aforesaid decoder 35.

IN1-IN4 are inversion circuits connected to the outputs of the OR gates OR1-OR4 respectively, and IN11-IN14 are also inversion circuits connected to the outputs of the OR gates OR11-OR14 respectively. ASW1-ASW8 are analogue switches of which the ASW2, ASW4, ASW6 and ASW8 have control inputs connected to the outputs of the aforesaid OR gates OR1-OR4. The ASW1, ASW3, ASW5 and ASW7 have control inputs which are connected to the outputs of the inversion circuits IN1-IN4 respectively.

Also ASW11-ASW18 are analogue switches of which the ASW11, ASW13, ASW15 and ASW17 have control inputs which are connected to the outputs of the inversion circuits IN11-IN14 respectively. The analogue switches ASW12, ASW14, ASW16 and ASW18 have control inputs which are connected to the outputs of the OR gates OR11-OR14 respectively.

42 is a constant voltage generating circuit having an output connected to a voltage divider of resistors 43, 44 and 45 whose resistance values are equal to one another. The aforesaid constant voltage generating circuit produces an output V1, causing a voltage V2 to appear at the junction point of the resistors 43 and 44, and causing a voltage V3 to appear at a junction point of the resistors 44 and 45.

IN22 is an inversion circuit connected to the output terminal of a pulse generating circuit PG, the pulse generating circuit producing a train of pulses at a frequency of, for example, 200 Hz. ASW21-ASW28 are analogue switches. Of these analogue switches, the inputs of the ASW21 and ASW25 are fed with the voltage V3, the inputs of the ASW22 and ASW26 are fed with the voltage V2, the inputs of the ASW23, ASW27 are fed with the aforesaid voltage V1, and the inputs of the ASW24 and ASW28 are fed with the earth level potential E. Again, of the aforesaid analogue switches ASW21-ASW28, the control inputs of the ASW22, ASW24, ASW25 and ASW27 are connected to the output of the pulse generating circuit PG, and the control inputs of the ASW21, ASW23, ASW26 and ASW28 are connected to the output of the inversion circuit IN22. Again, the outputs of the analogue switches ASW21 and ASW22 are connected to all the inputs of the analogue switches ASW1, ASW3, ASW5 and ASW7, and the outputs of the analogue switches ASW23 and ASW24 are connected to all the inputs of the analogue switches ASW2, ASW4, ASW6 and ASW8. On the other hand, the outputs of the analogue switches ASW25 and ASW26 are connected to all the inputs of the analogue switches ASW11, ASW13, ASW15 and ASW17, and the outputs of the analogue switches ASW27 and ASW28 are connected to all the inputs of the aforesaid analogue switches ASW12, ASW14, ASW16 and ASW18.

LC' is the aforesaid liquid crystal unit. Of the common electrodes KS1-KS4 provided on one of the plates of the liquid crystal cell LC', the KS1 is connected to the two outputs of the analogue switches ASW1 and ASW2, the KS2 to the two outputs of the analogue switches ASW3 and ASW4, the KS3 to the two outputs of the analogue switches ASW5 and ASW6, and the KS4 to the two outputs of the aforesaid analogue switches ASW7 and ASW8.

Also of the segment electrodes SG1-SG4 provided on the other plate of the aforesaid liquid crystal cell LC', the segment electrode SG1 is connected to the two outputs of the analogue switches ASW11 and ASW12, the SG2 to the two outputs of the analogue switches ASW13 and ASW14, the SG3 to the two outputs of the analogue switches ASW15 and ASW16, and the SG4 to the outputs of the analogue switches ASW17 and ASW18.

The operation of the liquid crystal exposure indicator for a camera of the present invention shown in FIG. 3 will next be described.

Now assuming that the light value computing circuit A produces an output representative of an exposure time based on the object brightness, and this output is converted by the A/D converter 32 to a digital signal, for example, [00001] that is latched by the latch circuit 33, then the decoder 35 produces a high level signal at the output terminal 1. Therefore, the OR gates OR11 and OR1 produce high level signals, while the OR gates OR12-OR14 and OR2-OR4 produce low level signals, thereby the ASW12, ASW13, ASW15 and ASW17 are selected from the analogue switches ASW11 to ASW18 to be turned on. Thus, the voltages appearing at the inputs of the said switches ASW12, ASW13, ASW15 and ASW17 are applied to the respective segment electrodes SG1 to SG4.

Figure 4A:
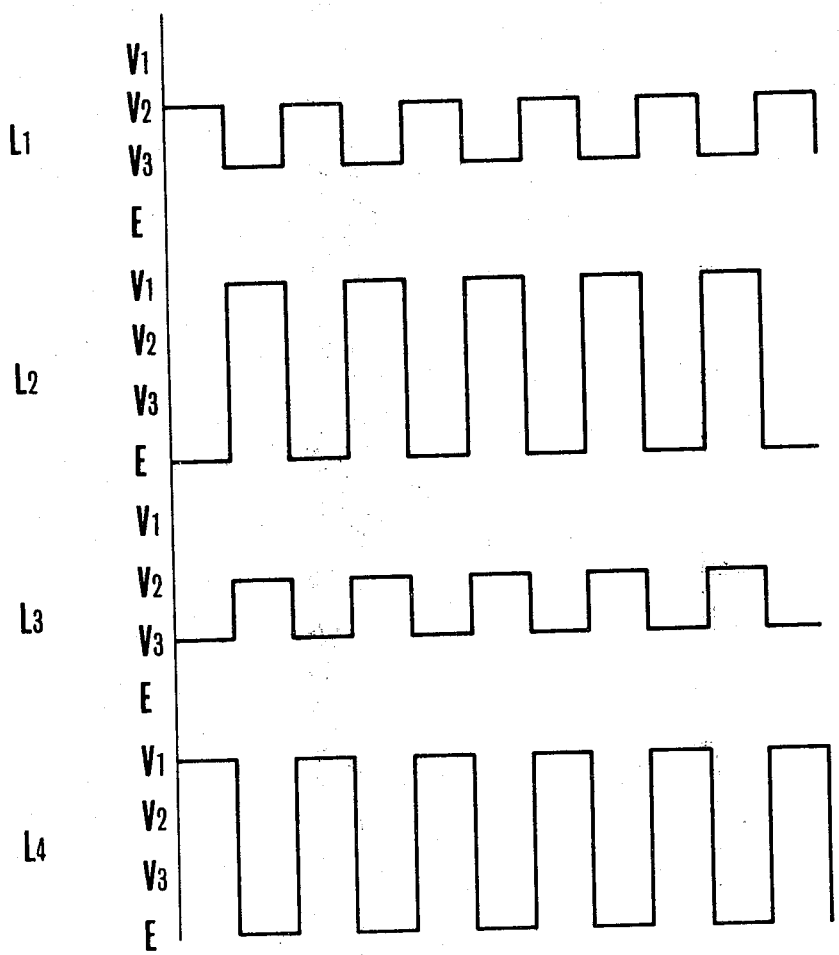
Figure 4B:
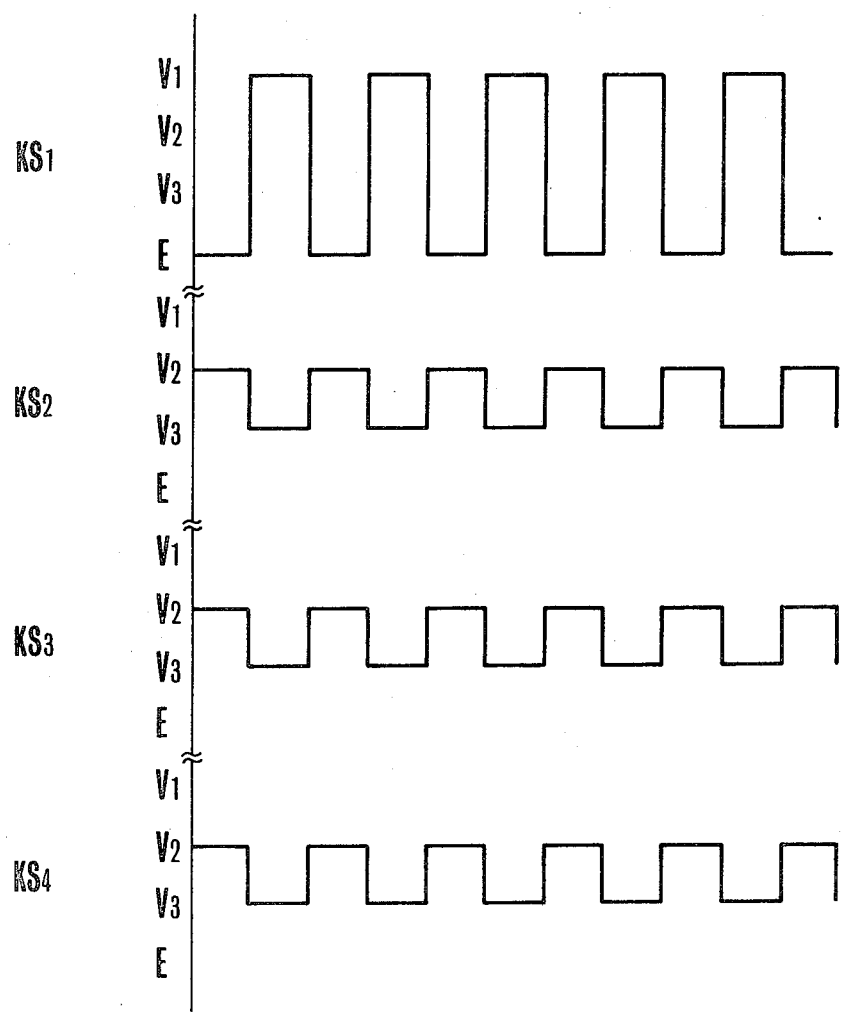

Since the aforesaid switch ASW12 is fed with a signal on a line L4, and the ASW13, ASW15 and ASW17 with a signal on a line L3, and since the control inputs of the analogue switches ASW21 to ASW28 are connected to the pulse generating circuit PG, constant voltage generating circuit 42 and the resistors 43 to 45 as has been mentioned above, the lines L1 to L4 are supplied with respective alternating voltages shown in FIG. 4(a). Thus, the potential in line L4 appears at the segment electrode SG1, and the potential in line L3 appears at the segment electrodes SG2 to SG4, as shown in FIG. 4(c). Further since the decoder 35 produces the signal of high level at the output terminal 1 as has been mentioned above, the analogue switches ASW2, ASW3, ASW5 and ASW7 are only selected from the ASW1 to ASW8 to be turned on. Therefore, the analogue switch ASW2 passes the pulses from the line L2 to the common electrode KS1, and the analogue switches ASW3, ASW5 and ASW7 pass the pulses from the line L1 to the common electrodes KS2 to KS4 therethrough. The pulses appearing at the common electrodes KS1 to KS4 are shown in FIG. 4(b). This leads to application of electrical potentials between the individual segments as shown in FIG. 4(d). In this case, therefore, the potential gradient established between the segment electrode SG1 and common electrode KS1 only is taken at an effective value of V volt (as V1=V volt), while the potential gradients between the other segment electrodes and common electrodes are taken at an effective value of ⅓ V volt. If the V value is previously adjusted to satisfy inequalities $(V/3) < Vth < V$, where Vth is the threshold voltage for the liquid crystal, the liquid crystal layer does not rotate the plane of polarization through 90° in only the area between the segment and common electrodes SG1 and KS1, while twisting it in the remaining area. Hence, the area D1 sandwiched between the segment electrode SG1 and common electrode KS1 is selected to appear dark on a white background as shown in FIG. 5(a).

FIG. 4(e) shows the relationship of the various outputs of the decoder 35 with the selected areas for exposure indications through the selective energization of the segment electrodes SG1-SG4 and common electrodes KS1-KS4. As has been mentioned above, when the decoder 35 produces the high level signal at the output terminal 1 as shown on the top line in FIG. 4(e), the segment electrode SG1 is energized by the line L4 and the common electrode KS1 is energized by the line L2, thereby establishing an indication in the area D1 only. The foregoing has been described in connection with the production of the high level signal at only the first output terminal of the decoder 35. But, as the object brightness changes, the production of the high level signal shifts over the range of the output terminals 2 to 29 of the decoder so that the corresponding combinations of the electrodes KS1-KS4 and SG1-SG4 with the lines L1-L4 are selected according to the table of FIG. 4(e), thereby one or two area or areas of the liquid crystal layer across which the electrical field by the voltages of the lines L2 and L4 is or are rendered opaque to present an exposure indication. In more detail, for example, when the high level signal is produced at the output terminal 3 of the decoder, the waveform of the line L2 appears at the electrode KS1, and the waveform of the line L4 appears at the two electrodes SG2 and SG3, so that the two areas D2 and D3 adjacent to each other are rendered effective for light shuttering simultaneously as shown in FIG. 5(b). It should be noted in this connection that what is indicated in an intermediate value between the full exposure values indicated by the areas D2 and D3.

Figure 6A:
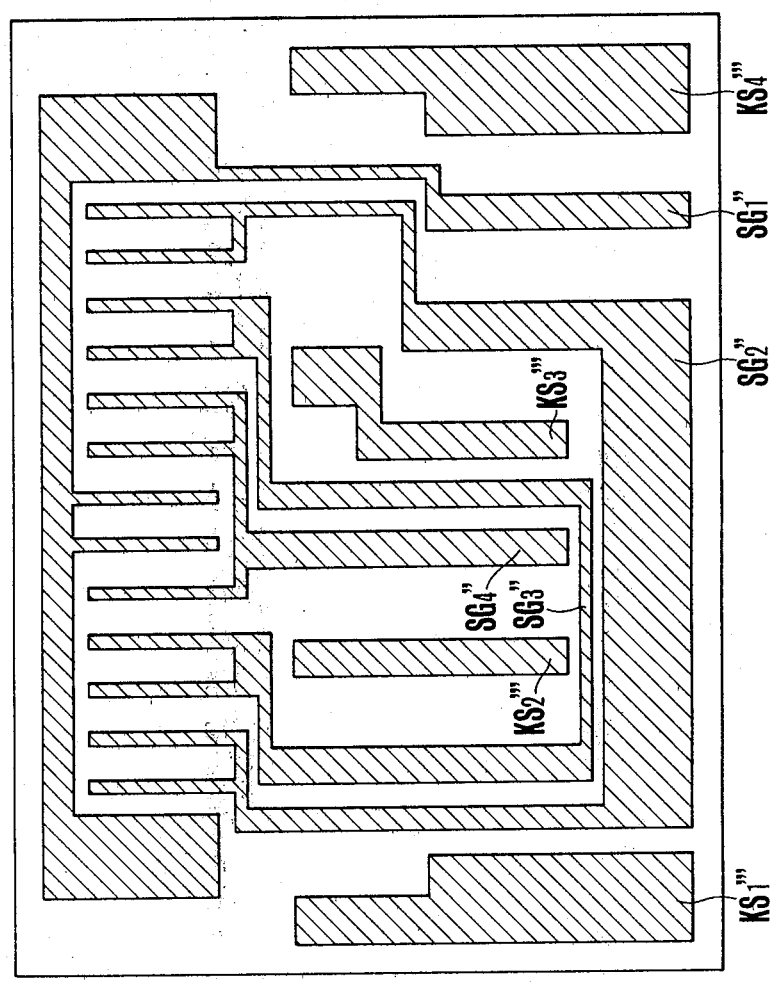
FIG. 6(a) is a plane view of another example of two sets of electrodes deposited on one substrate of a liquid crystal cell applicable to the indicator of the present invention.

FIG. 6 shows another embodiment of a liquid crystal cell used in an indicator for a camera according to the present invention. The patterns of transparent electrodes of the liquid crystal cell are adapted for use in a bracketing type exposure indicator. FIG. 6(a) shows the pattern of transparent electrodes on one substrate of the liquid crystal cell where SG1''-SG4'' are transparent segment electrodes, and KS1'''-KS4''' are transparent electrodes. FIG. 6(b) shows the pattern of transparent electrodes on the other substrate where KS1''-KS4'' are transparent common electrodes.

Figure 6C:
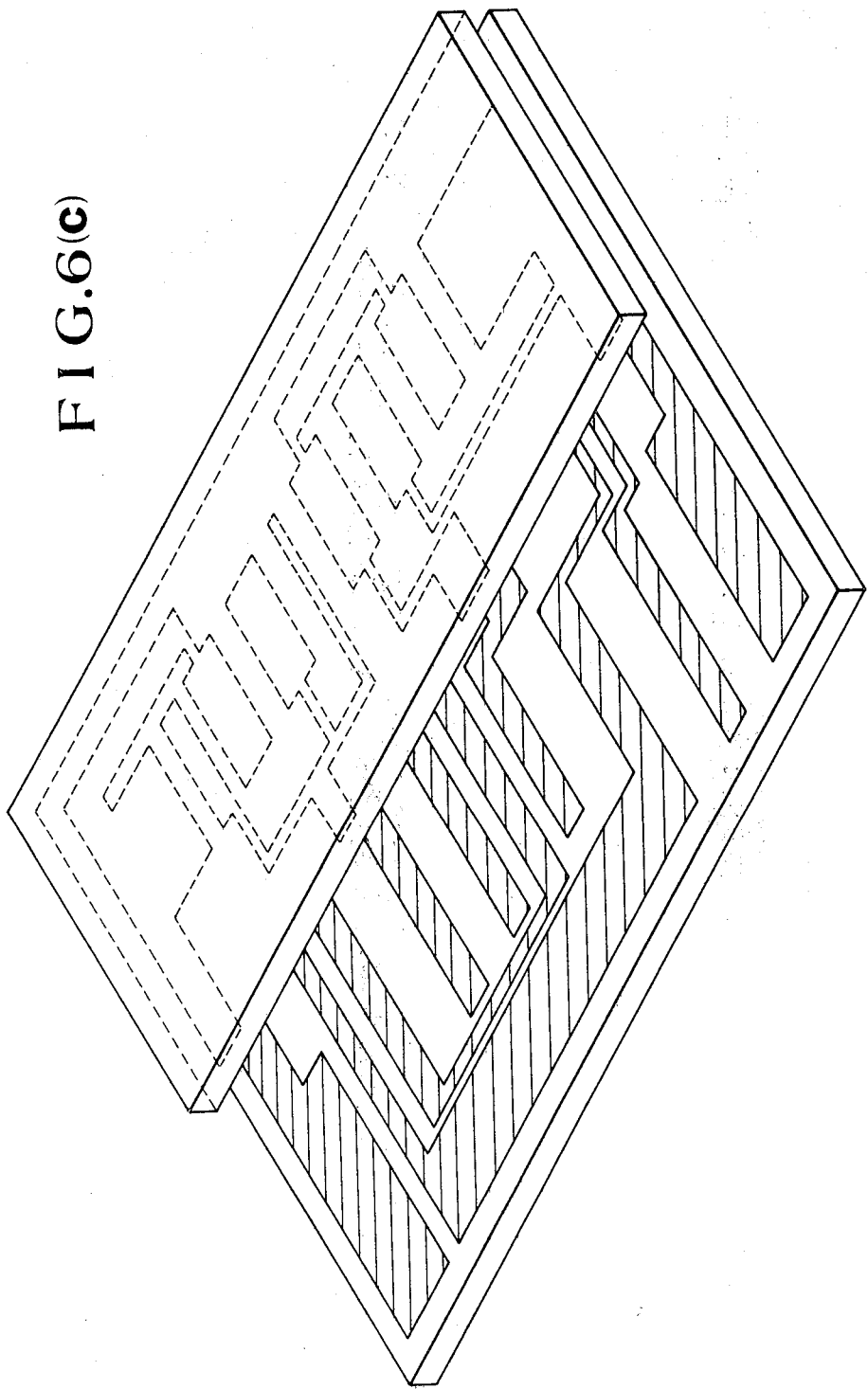
FIG. 6(c) is an end view of the liquid crystal cell constructed with the substrates of FIGS. 6(a) and 6(b).

FIG. 6(c) is a perspective end view of the oppositely assembled both substrates of FIGS. 6(a) and 6(b). It is to be noted that in order to complete them as a liquid crystal cell, the space between them must be filled with a liquid crystal material, and be surrounded by a suitable gasket, but their illustration is omitted. It is further noted that in order to effect light shuttering it is required to arrange two polarizing plates on opposite sides of this cell, but its illustration is also omitted. It is furthermore noted that the transparent electrodes KS1'''-KS4''' on one substrate are electrically connected to the respective transparent common electrodes KS1''-KS4'' through respective connectors (not shown), so that electrical conduction is established therebetween. As is so constructed, the leads to a drive circuit for the liquid crystal cell can be arranged along one common side, in this instance, left hand side of the liquid crystal cell to facilitate its incorporation in the finder of a camera.

Figure 7:
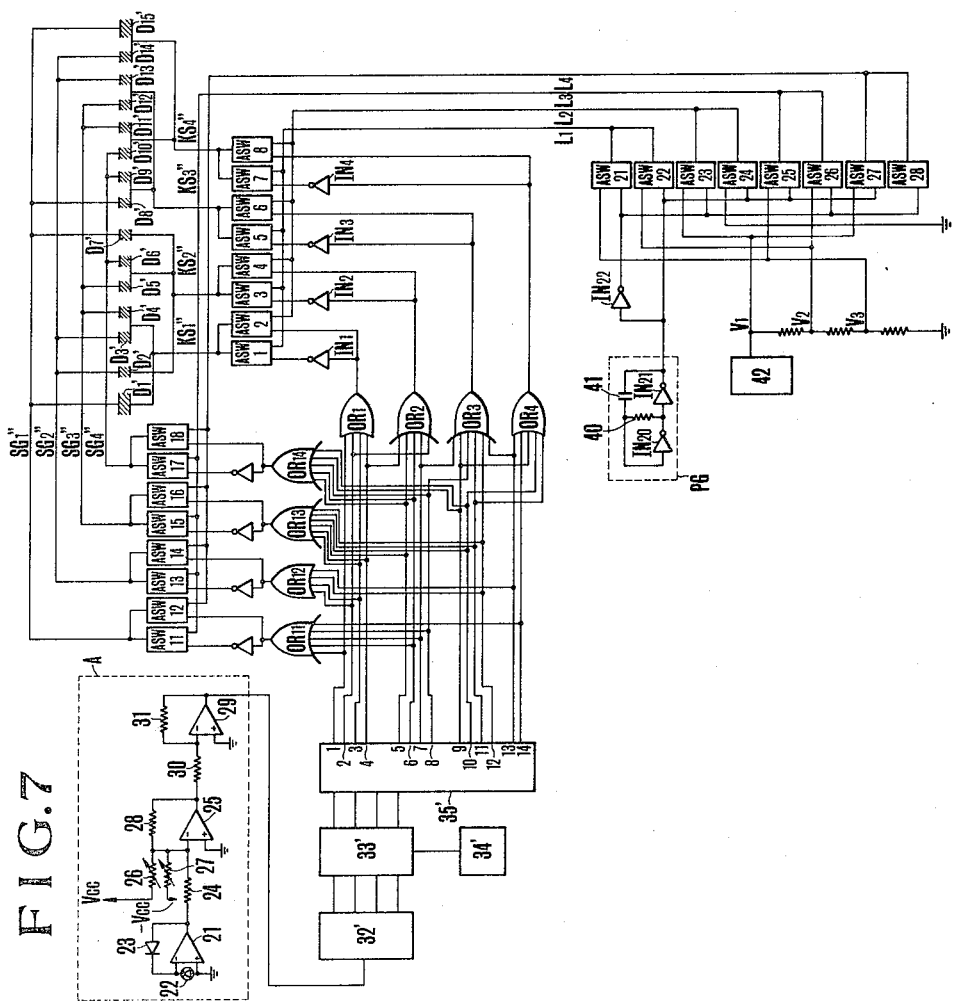
FIG. 7 is an electrical circuit diagram of another embodiment of an exposure indicator for a camera using the liquid crystal cell of FIG. 6.

FIG. 7 shows a drive circuit for driving the liquid crystal cell of FIG. 6. This circuit is almost similar in construction to that of FIG. 3, and therefore explanation will be given to different points only.

In FIG. 7, 32' is an A/D converter receptive of an analogue input signal for producing an output in the 4-bit binary coded form. 33' is a latch circuit responsive to an output pulse from the pulse generating circuit 34 for latching the 4-bit output. 35' is a decoder receptive of the 4-bit latch output for producing an output in decimal code form at 14 lines.

OR1–OR4 are OR gates having 4-6 inputs with the OR1 connected to the outputs 1-4 of the decoder 35′, with the OR gate OR2 connected to the outputs 2, 4, 5, 6 and 7, with the OR gate OR3 connected to the outputs 7, 8, 9, 11, 12 and 13, and with the OR gate OR4 connected to the outputs 9, 10, 11, 13 and 14. The other parts are similar in construction to those shown in FIG. 3, and no explanation is given thereto.

The operation of the bracketing type exposure indicator of FIGS. 6 and 7 will next be described.

Now assuming that in a similar manner to that described in connection with the FIG. 3 embodiment, a high level signal is produced at a predetermined output terminal of the decoder 35′, for example, the first output terminal 1, depending upon the object brightness level, then the OR gate OR11 produces a high level signal output, causing the switch ASW12 to be selected, while the OR gates OR12–OR14 produce low level signal outputs since the decoder 35′ produces low level signal outputs at the other output terminals than the first one. Therefore, the high level signal is transmitted through the inversion circuit to the switches ASW13, ASW15 and ASW17. Thus, the switches ASW13, ASW15 and ASW17 are selected to be gated on. Since the switch ASW12 is connected to the line L4, and the switches ASW13, ASW15 and ASW17 are connected to the line L3, the segment electrode SG1″ is energized by the waveform of the line L4, and the segment electrodes SG2″–SG4″ are energized by the waveform of the line L3 as shown in FIG. 8. On the other hand, at this time, responsive to the output of the decoder 35′, the OR gate OR1 produces a high level signal output, and the OR gates OR2–OR4 produce low level signal outputs, thereby the switches ASW2, ASW3, ASW5 and ASW7 are turned on. As shown in FIG. 8, therefore, the electrode KS1″ is energized by the waveform of the line L2 and the electrodes KS2″, KS3″ and KS4″ by the waveform of the line L1. The pulse voltages appearing at the lines L1–L4 are the same as in the aforesaid embodiment of FIG. 3, so that only the area of the liquid crystal layer between the electrodes on which the waveforms of the lines L2 and L4 are applied is rendered to effect light shuttering, thus presenting an indication or exposure indication. As has been mentioned above, the waveform of the line L2 is applied to the electrode KS1″, and the waveform of the line L4 is applied to the electrode SG1″, so that the area D1′ becomes dark as shown in FIG. 9(c). The foregoing has been described in connection with the production of the high level signal output at the output terminal 1 of the decoder 35′. As the object brightness changes, when the decoder 35′ produces a high level signal at any one of the output terminals 2 to 15, a corresponding combination of electrodes are energized by the waveforms of the lines L2 and L4 to effect light shuttering in two selected areas adjacent to each other. In more detail, when the actual object brightness causes the decoder 35′ to produce a high level signal at a corresponding one of the output terminals, for example 2, as shown in FIG. 8, the electrodes KS1″ and KS2″ are energized by the waveform of the line L2, and the electrode SG2″ is energized by the line L4, thereby the areas D2′ and D3′ are rendered to effect light shuttering, thus bracketing an indicium representative of an exposure value, in this instance, 1000, as shown in FIG. 9(a).

Figure 10A:
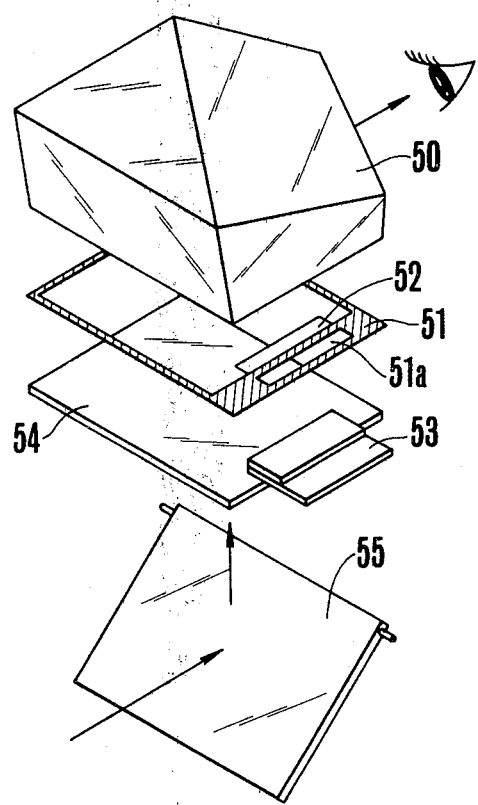
FIG. 10(a) is an exploded perspective view of an example of a finder optical system of the camera using the liquid crystal cell of the present invention.

Examples of arrangement of the liquid crystal cells of FIGS. 1 and 6 in the finder optical systems of cameras are shown in FIG. 10. FIG. 10(a) shows an example of application of it to the finder optical system of a single lens reflex camera where particular care is taken in arranging the liquid crystal cell to be illuminated by a portion of the light entering through the objective lens of the camera. In the figure, 50 is a penta prism; 51 is a field mask provided with a window 51a in alignment with the liquid crystal cell 53; 52 is a calibrated plate of transparent material attached to the aforesaid field mask 51 at such location that its shutter speed (or diaphragm value) scale cooperates with the selected areas of the liquid crystal cell 53. The liquid crystal cell 53 may be either of the ones shown in FIGS. 1 and 6. 54 is a focusing screen; 55 is a quick-return reflection mirror. With the finder optical system of such construction, light entering through the objective lens (not shown) is reflected from the mirror 55 to the focusing screen 54 and the liquid crystal cell 53, and therefrom directed to the penta prism 50, finally reaching an eye of the photographer.

Figure 10B:
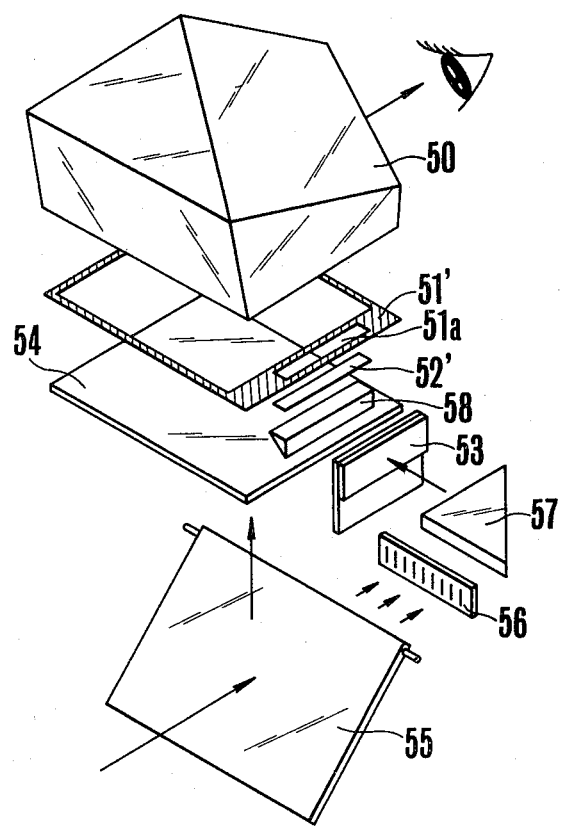
FIG. 10(b) is an exploded perspective view of another example of a finder optical system of the camera adapted for use with the liquid crystal cell of FIG. 6.

FIG. 10(b) also shows the arrangement of the liquid crystal cell type indicator in the finder optical system of a single lens reflex camera. In this example, however, illumination of the liquid crystal cell is effected by light entering through a separate opening from the objective lens. In the figure, 50 is a penta prism; 51′ is a field mask provided with a window 51′a for the exposure indicator. 52′ is a transparent scale plate attached to the field mask 51′ on which shutter speed values (or diaphragm values) are calibrated. 56 is a window for introducing external light; 57 and 58 are triangle prisms separated by a space in which the liquid crystal cell is positioned. 54 is a focusing screen, and 55 is a quick-return reflection mirror. With the finder optical system of such construction, light entering through the window 56 is reflected by the triangle prism 57 to the left and then passes through the liquid crystal cell 53 to the triangle prism 58 by which it is reflected upward to the penta prism, reaching the eye of the photographer. Thus, the exposure indication can be observed at one side of the field of view of the finder.

Figure 11B:
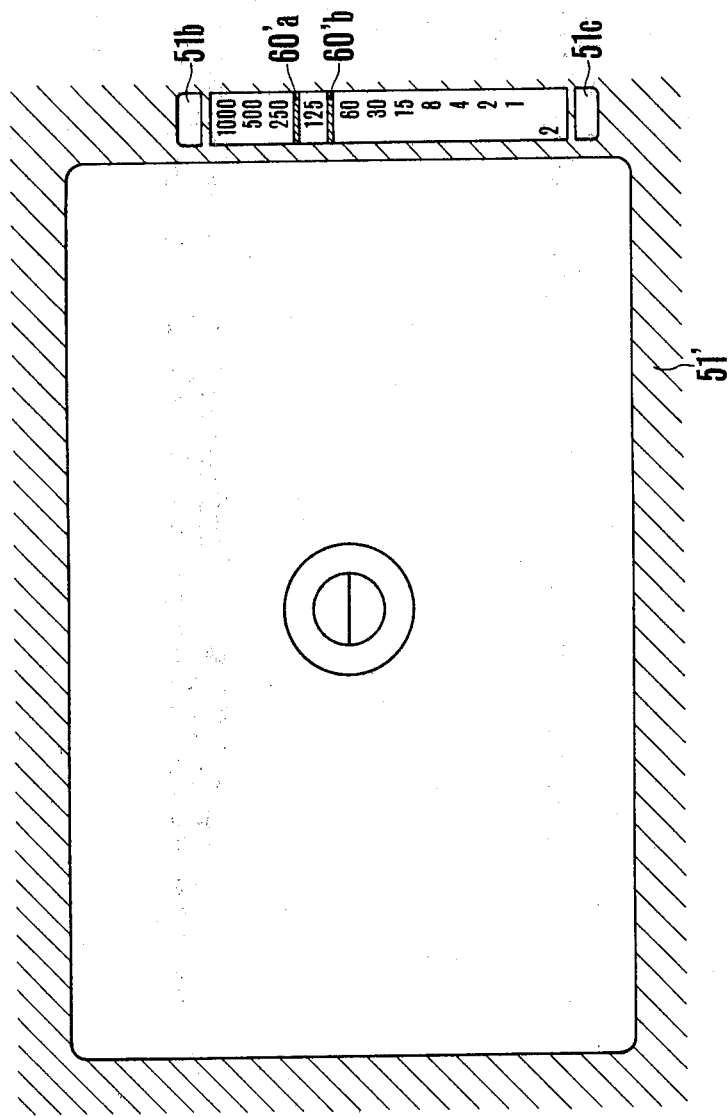

FIG. 11 shows the field of view of the finder of FIG. 10 along with the exposure indication by the liquid crystal cell. In FIG. 11(a), the exposure indication is given by the liquid crystal cell of FIG. 1 driven by the circuit of FIG. 3 and is presented in half-step increments. In the figure, 51 is the field mask shown in FIG. 10(a); 52 is the scale plate; 51b and 51c are windows for warning of over- and under-exposures respectively; 60a and 60b are the selected areas of the liquid crystal cell, indicating an exposure value or shutter speed lying between 1/60 and 1/30 second. It will be appreciated that the selection of two adjacent areas for light shuttering at a time makes it possible to indicate even intermediate exposure values. FIG. 11(b) shows the appearance of an exposure indication in the bracketed form by the liquid crystal cell of FIG. 6 in combination with the circuit of FIG. 7. In the figure, 51′ is the field mask shown in FIG. 10(b); 51b and 51c are windows for warning of over- and under-exposures respectively; and 60′a and 60′b are selected areas for light shutter indicating an effective exposure value, in this instance, shutter time of 1/125 second. It is noted that the scale plate and the liquid crystal cell are overlapped each other. Thus, the use of the bracketing type exposure indicator in the camera finder, because of its allowing for overlap of the scale plate and the liquid crystal cell, can provide a novel mode of indicating operation which was impossible by the conventional type indicators using the meter and LEDs.

As has been described in detail above, according to the present invention the liquid crystal indicator is enabled to provide an increased number of exposure values in the dot form by an extremely reduced number of electrodes. Therefore, the exposure values can be indicated not only in one step increments but also in half-step increments. Further, the presentation of the exposure indication can be performed in a new manner as is bracketed. These features of the liquid crystal exposure indicator of the present invention are very advantageous when used in cameras or the like.

What is claimed is:

1. A liquid crystal indicating device for a camera, comprising:
   (a) a liquid crystal cell which includes two base plates facing each other and sandwiching a liquid crystal substance therebetween and a plurality of transparent electrodes outside of each of said plates, the transparent electrodes on the plates forming a plurality of pairs of electrodes opposing each other, and said pairs of electrodes opposing each other being arranged in a matrix and related with other pair or pairs so that any one of the electrodes forming each pair of opposing electrodes is electrically connected with any one of the electrodes forming an adjacent pair of electrodes opposing each other, and
   (b) a driver circuit for applying an alternating voltage of an amplitude above the voltage level for light shuttering of the liquid crystal cell to one of the transparent electrodes positioned at one side of the cell, and for applying a voltage of opposite phase to and of the same amplitude as that of the alternating voltage to one or two of the electrodes positioned at the other side of the cell, so that one or two of the plurality of pairs of electrodes of the cell opposing each other are placed in a light shuttering state, the electrode to which said alternating voltage of amplitude above the voltage level for light shuttering of the light crystal cell is to be impressed being selected so that the one or two pairs of electrodes placed in a light shuttering state are consecutively shifted by one bit each in a direction of the above mentioned matrix corresponding to a change in one direction of an input signal level.

2. A liquid crystal indicating device for a camera according to claim 1, wherein the aforesaid plurality of pairs of electrodes opposing each other includes a plurality of common electrodes on one of the base plates of the cell and a plurality of segment electrodes on the other base plate, and each of the segment electrodes facing each of the common electrodes.

3. A liquid crystal indicating device for a camera according to claim 1, wherein the other electrodes on the same base plate as the electrode to which said drive circuit applies an alternating voltage having an amplitude above the voltage level for light shuttering of the liquid crystal receives an alternating voltage of opposite phase to the alternating voltage and of amplitude below the light shuttering level for the liquid crystal.

4. A liquid crystal indicating device for a camera according to claim 3, wherein a ratio of the voltage amplitude above the light shuttering voltage level for the liquid crystal to the voltage amplitude below said voltage level for the liquid crystal is 3:1.

5. A liquid crystal indicating device for a camera according to claim 1, wherein an input signal to said driver circuit represents an object brightness.

6. A liquid crystal indicating device for a camera according to claim 1, wherein the waveform of the alternating voltage is rectangular.

7. A liquid crystal indicating device for a camera according to claim 1, wherein the number of opposing areas simultaneously actuated to effect light shuttering is always two, and which further comprises indicating means having a plurality of data arranged consecutively, each of said plurality of data and each pair of electrodes opposing each other being placed alternately with a predetermined one of a plurality of the data to be indicated being bracketed by said two opposing areas.

8. A liquid crystal indicating device for a camera according to claim 1, further comprising indicating means having a plurality of data arranged consecutively, and each of the data of the indicating means and each of the pairs of electrodes of the cell opposing each other being arranged to correspond to each other, one of the data of the indicating means corresponding to one of the pairs of the opposing electrodes of the cell being indicated when said corresponding one of the pairs of electrodes is in a light shuttering state, two of the plurality of data of the indicating means adjacent each other being indicated when two pairs of the opposing electrodes of the cell adjacent each other are in the light shuttering state, so that an intermediate value between the two of the data is indicated.

9. A liquid crystal indicating device for a camera according to claim 1, wherein all external connection terminals for the electrodes wired in patterns on the two base plates of the aforesaid row-like liquid crystal cell are arranged on one side of said row-like liquid crystal cell.

10. A liquid crystal indicating device for a camera, comprising:
    a liquid crystal cell including two base plates facing each other,
    a liquid crystal substance sandwiched by said base plates,
    a plurality of transparent electrodes on the plates and forming a matrix,
        said matrix forming a plurality of cross-over points, with liquid crystal at the cross-over points, the liquid crystal at said cross-over points being rendered optically distinct from the liquid crystal at others of said points by the application of a first voltage at the cross-over points exceeding a predetermined threshold value,
    circuit means for applying a first alternating voltage having an amplitude above the first voltage across one of the electrodes on one of the plates, and for applying a second alternating voltage of opposite phase and same amplitude as the first alternating voltage to said electrodes on the other of said plates,
    said cross-over points being in the order of 1, 2, 3, ... n−1, n,
    said circuit means being arranged for applying the first and second alternating voltages to the electrodes so as to cause an optical change in the liquid crystal at cross-over points in the following order 1, 1&2, 2, 2&3, 3, ... n−2, n−2 & n−1, n−1, n−1 & n, n.

* * * * *